(12) United States Patent
Remmers et al.

(10) Patent No.: US 7,906,976 B2
(45) Date of Patent: Mar. 15, 2011

(54) SWITCHED CAPACITOR MEASUREMENT CIRCUIT FOR MEASURING THE CAPACITANCE OF AN INPUT CAPACITOR

(75) Inventors: Robert Remmers, Altdorf (DE); John Vogt, Denton, TX (US)

(73) Assignees: Texas Instruments Deutschland GmbH, Freising (DE); Texas Instruments Incorporated, Dallas, TX (US)

( * ) Notice: Subject to any disclaimer, the term of this patent is extended or adjusted under 35 U.S.C. 154(b) by 371 days.

(21) Appl. No.: 12/204,554

(22) Filed: Sep. 4, 2008

(65) Prior Publication Data

US 2009/0174417 A1    Jul. 9, 2009

Related U.S. Application Data

(60) Provisional application No. 61/016,905, filed on Dec. 27, 2007.

(30) Foreign Application Priority Data

Sep. 6, 2007   (DE) .......................... 10 2007 042 315

(51) Int. Cl.
   *G01R 27/26*   (2006.01)
(52) U.S. Cl. ........ 324/686; 341/142; 324/519; 324/663; 324/658
(58) Field of Classification Search ................... 324/686
   See application file for complete search history.

(56) References Cited

U.S. PATENT DOCUMENTS 4,058,808 A * 11/1977 Malaviya ...................... 341/124
6,275,047 B1 * 8/2001 Zoellick et al. ............... 324/678
(Continued)

FOREIGN PATENT DOCUMENTS

WO      85/03358 A    8/1985

OTHER PUBLICATIONS

Bernard Binger, authorized officer, International Searching Authority, PCT Notification of Transmittal of the International Search Report and the Written Opinion of the International Searching Authority, or the Declaration, date of mailing May 20, 2009, International Application No. PCT/EP2008/061764, international filing date Sep. 5, 2008.

*Primary Examiner* — Timothy J Dole
*Assistant Examiner* — Benjamin M Baldridge
(74) *Attorney, Agent, or Firm* — William B. Kempler; Wade J. Brady, III; Frederick J. Telecky, Jr.

(57) ABSTRACT

A switched capacitor measurement circuit is provided for measuring the capacitance of an input capacitor with a parallel parasitic resistor. The circuit comprises a switching arrangement, a reference capacitor, a steered current sink and an operational amplifier with an output, a non-inverting input connected to a reference voltage source and an inverting input connected to a first terminal of the input capacitor. The current sink is steered to compensate for a charge current due to the parasitic resistor. Still further, the circuit comprises a digital adder and an analog-to-digital converter with an analog input connected to the output of the operational amplifier and a digital output connected to a first input of the digital adder. A second input of the digital adder receives a negative digital error signal and the output of the digital adder provides a digital capacitance measurement signal corrected for an error current which is integrated across the reference capacitor in the gain mode due to the slewing of the operational amplifier.

19 Claims, 3 Drawing Sheets

U.S. PATENT DOCUMENTS

| | | | |
|---|---|---|---|
| 6,683,462 B2 * | 1/2004 | Shimizu | 324/658 |
| 6,946,983 B2 * | 9/2005 | Andersson et al. | 341/118 |
| 7,307,485 B1 * | 12/2007 | Snyder et al. | 331/150 |
| 7,385,404 B2 * | 6/2008 | Puma et al. | 324/548 |
| 7,804,307 B1 * | 9/2010 | Bokma et al. | 324/663 |
| 2001/0020850 A1 * | 9/2001 | McIntosh et al. | 324/519 |
| 2002/0101251 A1 * | 8/2002 | Shimizu | 324/677 |
| 2004/0090237 A1 * | 5/2004 | Kasperkovitz | 324/681 |
| 2006/0279321 A1 | 12/2006 | Ruppender et al. | |
| 2008/0024110 A1 * | 1/2008 | Nikolaus | 324/71.1 |

* cited by examiner

SWITCHED CAPACITOR MEASUREMENT CIRCUIT FOR MEASURING THE CAPACITANCE OF AN INPUT CAPACITOR

FIELD OF THE INVENTION

The present invention relates to a switched capacitor measurement circuit for measuring the capacitance of an input capacitor with a parallel parasitic resistor.

BACKGROUND OF THE INVENTION

A typical switched capacitor measurement circuit uses a gain stage for measuring the capacitance of a capacitor by comparison to a reference capacitor. A switching arrangement, with switches appropriately controlled by phase signals, alternately connects the capacitor to be measured and the reference capacitor between a reference voltage and an input voltage. In reset mode, both capacitors are discharged by being connected to the reference voltage. In gain mode, the reference capacitor is connected across the output and the inverting input node of the operational amplifier, and the capacitor to be measured is connected between the input voltage node and the inverting input node of the operational amplifier. In gain mode, the output voltage of the operational amplifier is representative of the capacitance to be measured.

However, when the capacitor the capacitance of which is to be measured, has a parallel parasitic resistor, the measurement is affected by an error which is the greater the smaller is the resistance of the resistor.

SUMMARY OF THE DISCLOSURE

The invention provides a switched capacitor measurement circuit for measuring the capacitance of an input capacitor with a parallel parasitic resistor, wherein the measurement error due to the parallel resistor is compensated.

A first aspect of the invention is based on a compensation for the charge current due to the parasitic resistor. This is achieved with a steered current sink connected to the interconnection node between the capacitor to be measured, the so called "input capacitor", and the reference capacitor. This first approach provides a considerable improvement, but, due to the limited speed of the operational amplifier, an error remains. For example, with a to be measured capacitor of 100 pF and a parallel resistor of a resistance down to 10 kOhm, the remaining error can be as large as 20%. Further improvement could be obtained by choosing a very fast operational amplifier. This is not trivial since bandwidth depends on the capacitor load which may be relatively high for some applications. Alternatively a two-stage Miller-compensated operational amplifier will provide constant bandwidth, but the required high bandwidth could easily lead to instability, especially in applications where the capacitor to be measured is an off-chip capacitor.

A second aspect of the invention reduces the error to an acceptable level. For example, in a situation where the error is about 10% without the inventive error correction, the error is reduced to less than 1%.

The invention may provide a switched capacitor measurement circuit for measuring the capacitance of an input capacitor with a parallel parasitic resistor. The circuit comprises a switching arrangement, a reference capacitor, a steered current sink and an operational amplifier with an output, a non-inverting input connected to a reference voltage source and an inverting input connected to a first terminal of the input capacitor. The switching arrangement selectively connects: in a reset mode, a second terminal of said input capacitor with the reference voltage source, the inverting input of the operational amplifier with the output of the operational amplifier, and the reference capacitor between the reference voltage source and the inverting input of the operational amplifier; in a gain mode, the second terminal of said input capacitor with a supply voltage, the reference capacitor between the inverting input and the output of the operational amplifier, and the steered current sink with an interconnection node between the input capacitor and the reference capacitor.

The current sink may be steered to compensate for a charge current due to the parasitic resistor. Still further, the circuit comprises a digital adder and an analog-to-digital converter with an analog input connected to the output of the operational amplifier and a digital output connected to a first input of the digital adder. A second input of the digital adder receives a negative digital error signal and the output of the digital adder provides a digital capacitance measurement signal corrected for an error current which is integrated across the reference capacitor in the gain mode due to the slewing of the operational amplifier. As will be seen, the current sink acts to subtract from the inverting input node of the operational amplifier a current equal to the leakage current caused by the parasitic parallel resistor. The amount of that current is determined with a control loop that tends to eliminate the slope of the voltage over time across the reference capacitor. As to the correction for the error due to the slewing of the operational amplifier, the idea is to first convert the output voltage of the operational amplifier to a digital output and to calculate a digital error correction value subtracted from the digitized output, using readily available parameters.

Using the digital error correction, the operational amplifier should not need a high bandwidth and stability is thus less critical. No additional analog circuitry is required for compensation.

BRIEF DESCRIPTION FOR THE DRAWINGS

Further advantages and features of the invention will ensue from the following detailed description with reference to the appending drawings. In the drawings.

Figure 1:
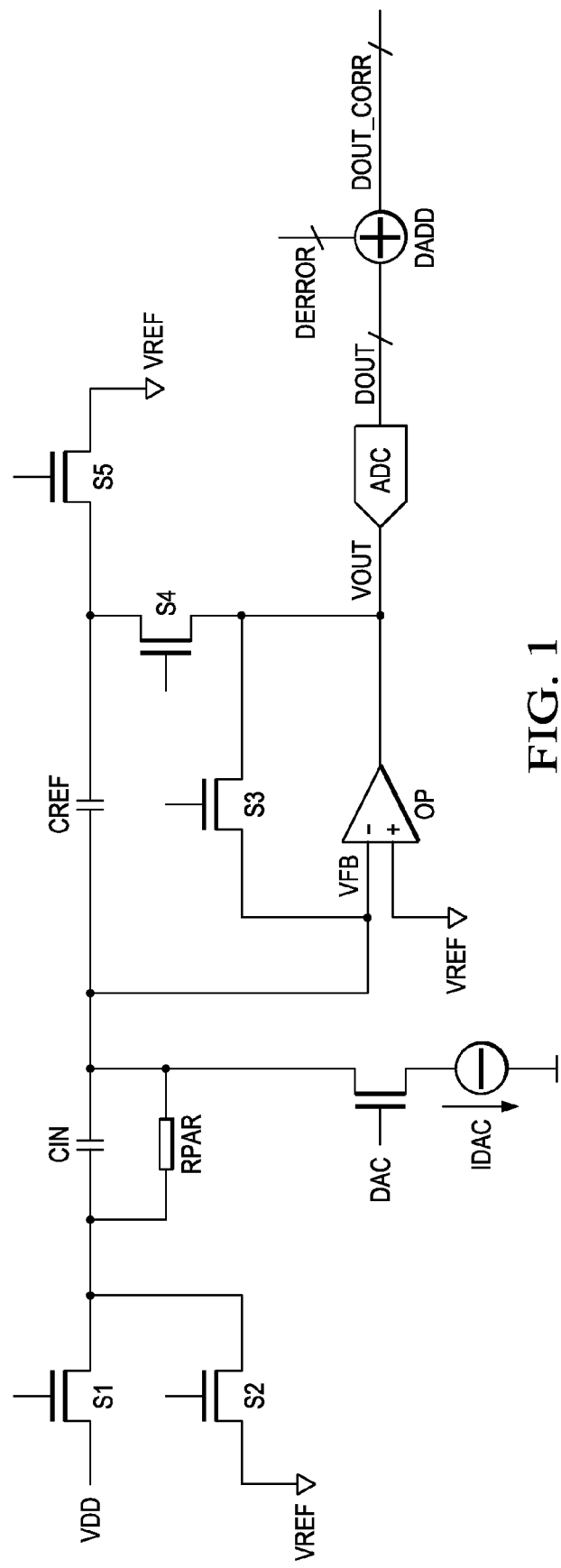
FIG. 1 shows a schematic of the inventive switched capacitor measurement circuit showing the principle components.
Figure 4:
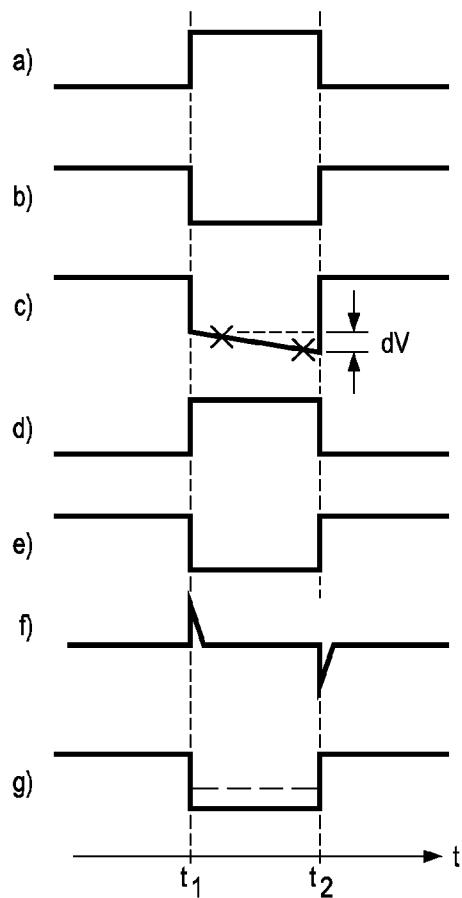
Figure 5:
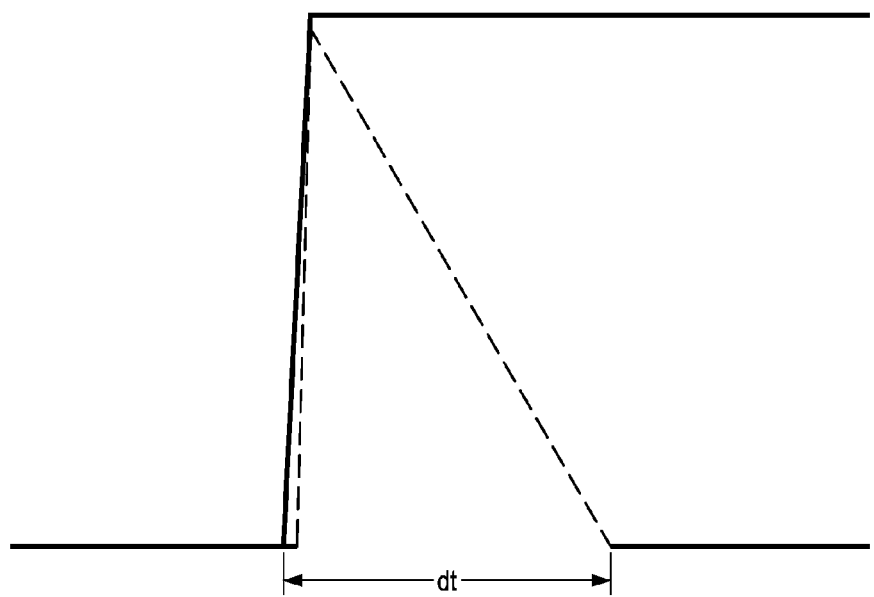

FIGS. 4a to g show voltage-over-time and current-over-time diagrams for different points in the schematic of FIG. 1; and FIG. 5 is a voltage-over-time diagram for the voltage at the inverting input of the operational amplifier shown in FIG. 1.

DETAILED DESCRIPTION OF THE INVENTION

FIG. 1 shows an embodiment of the inventive switched capacitor measurement circuit for measuring the capacitance of an input capacitor CIN. Parallel to the capacitor CIN is connected a parasitic resistor RPAR. In prior switched capacitor measurement circuits this parallel resistor is assumed to be infinite. An aspect of inventive switched capacitor measurement circuit on the contrary is provided for applications where the parallel parasitic resistor RPAR may be as low as 10 kΩ. The circuit further includes a switching arrangement with switches S1 to S5 and a switch DAC, a reference capacitor CREF, a steered current sink IDAC and an operational amplifier OP. The steered current sink in the embodiment shown is a digitally-controlled current sink. A first terminal of the input capacitor CIN is connected to an inverting input of the operational amplifier OP and a second terminal of the input capacitor CIN is connected to switches S1 and S2 of the switching arrangement. Switch S1 is connected with its second terminal to a supply voltage VDD whereas switch S2 is connected with its second terminal to a reference voltage VREF. Input capacitor CIN is further connected with its first terminal to the steered current sink IDAC via the switch DAC and to a first terminal of the reference capacitor CREF. Reference capacitor CREF is connected with its second terminal to switches S4 and S5 of the switching arrangement. Switch S5 is connected with its second terminal to the reference voltage VREF whereas switch S4 is connected with its second terminal to an output of the operational amplifier OP. The output of the operational amplifier OP is further connected via switch S3 to the inverting input of the operational amplifier OP. A non-inverting input of the operational amplifier OP is connected to the reference voltage VREF. An analog-to-digital converter ADC is connected with its analog input to the output of the operational amplifier and with its digital output to a digital adder DADD. The digital adder DADD receives in addition to the digital output signal DOUT of the analog-to-digital converter ADC a digital error signal DERROR which will be explained later. The digital adder DADD outputs a digital capacitance measurement signal DOUT-CORR which is digitally corrected for an error current.

Figure 2:
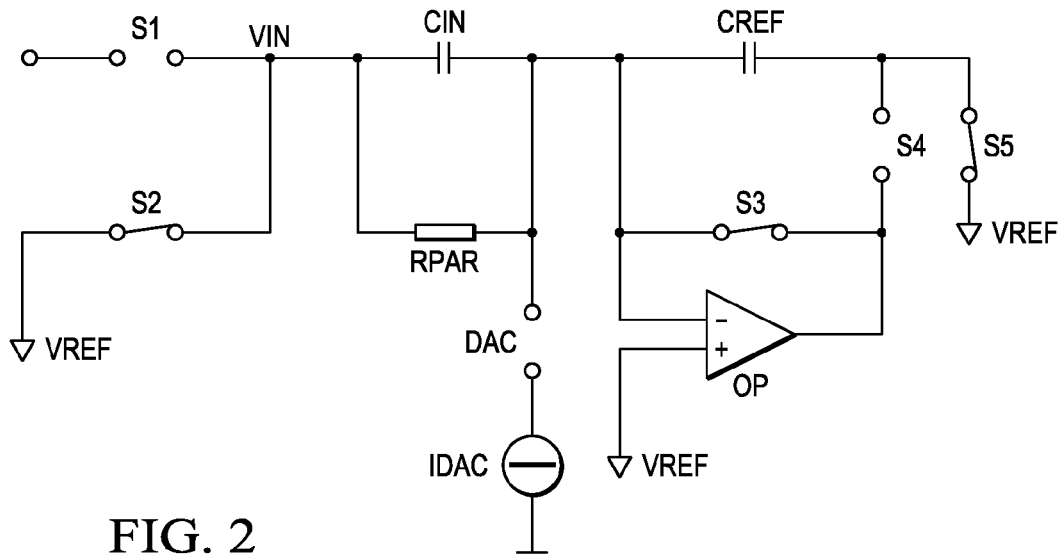
FIG. 2 shows the schematic of FIG. 1 in a simplified manner illustrating the reset mode.
Figure 3:
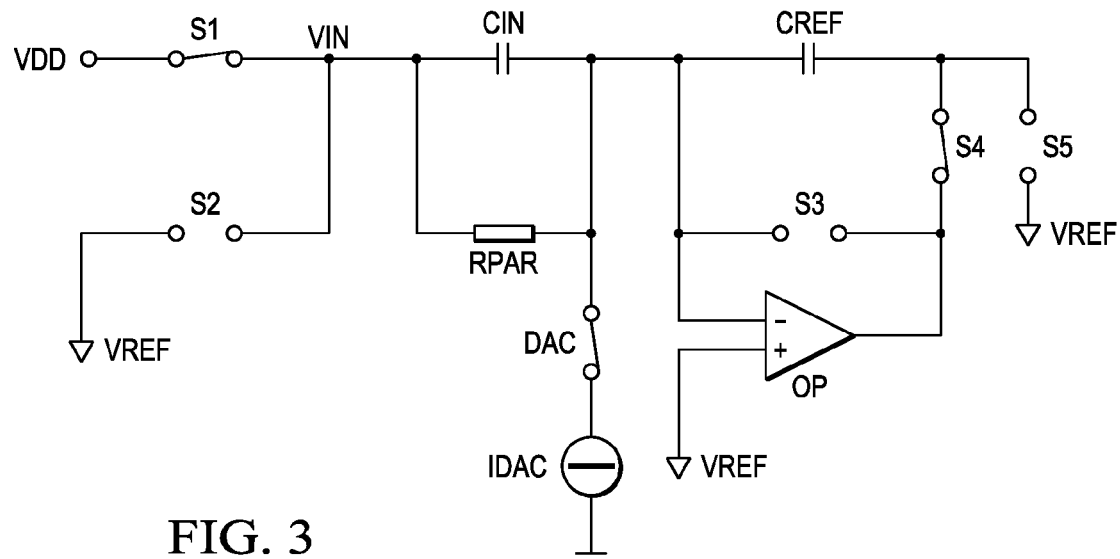
FIG. 3 shows the schematic of FIG. 1 in a simplified manner illustrating the gain mode.

The function of the switched capacitor measurement circuit will now be described with reference to FIGS. 2 and 3 which show a part of the circuit of FIG. 1 in a simplified form. Switches S1 to S5 as well as switch DAC which in a preferred embodiment are realized by field effect transistors, are shown in FIGS. 2 and 3 as simple switches. FIG. 2 shows the switched capacitor measurement circuit in a reset mode. Switches S2, S3 and S5 are closed whereas switches S1, S4 and DAC are open. Thus, the second terminal of the input capacitor CIN is connected to the reference voltage VREF, the inverting input of the operational amplifier OP is connected with the output of the operational amplifier OP and the reference capacitor CREF is connected between the reference voltage VREF and the inverting input of the operational amplifier OP. Thus, in reset mode, both capacitors CIN and CREF are connected to the reference voltage VREF and are discharged. The inverting input of the operational amplifier is short-circuited to the output of the operational amplifier OP and by this feedback, the voltage difference between inverting and non-inverting input of operational amplifier OP is forced to zero. Thus, the voltage at the inverting input as well as the output voltage are set to the reference voltage VREF.

FIG. 3 visualizes the measurement circuit in its gain mode. Switches S1, S4 and DAC are closed whereas switches S2, S3 and S5 are open. Thus, the second terminal of the input capacitor CIN is connected to the supply voltage VDD. The reference capacitor CREF is connected between the inverting input of the operational amplifier OP and the output of the operational amplifier OP, i.e in the feedback path, and the steered current sink IDAC is connected with an interconnection node between the input capacitor CIN and the reference capacitor CREF. When changing from the reset mode to the gain mode by activating the switching arrangement thereby closing switches S1, S4 and DAC and opening switches S2, S3 and S5, there is a voltage VDD-VREF across the input capacitor CIN and thus across the parallel parasitic resistor RPAR. The voltage VDD-VREF will therefore lead to a leakage current through resistor RPAR which will charge the reference capacitor CREF. This current is compensated for by the steered current sink IDAC via the switch DAC. A not shown control loop as known in the state of the art determines the slope of the voltage over time across the reference capacitor CREF and determines by this slope the current needed for compensation. A flat slope means exact compensation of the leakage current through the parallel resistor. This compensation only works well if the switch DAC is switched on exactly when the input voltage applied to capacitor CIN is switched from the reference voltage VREF to the supply voltage VDD, i.e. when the circuit is switched from reset to gain mode.

A problem occurring when the input voltage changes from reference voltage VREF to supply voltage VDD is that although the operational amplifier OP is connected to maintain a voltage difference of zero between its two inputs, the inverting input will not remain at the reference potential VREF since this would require an infinite fast amplifier. The voltage at the inverting input will first tend to follow the changed input voltage and then settle back to the reference voltage VREF with a speed depending on the bandwidth of the amplifier.

FIGS. 4a to g visualize the behaviour of the measurement circuit with and without a parallel resistor RPAR using voltage and current diagrams over time.

At a time t1, the switching arrangement is activated to change from the reset mode to the gain mode. At a time t2, the switching arrangement is activated to change back from the gain mode to the reset mode. FIG. 4a shows the input voltage which changes from the reference voltage VREF to the supply voltage VDD at t1 and back to reference voltage VREF at time t2. FIG. 4b shows the output voltage at the output of the operational amplifier OP in an ideal case, i.e. when the parallel resistance RPAR is infinite. There is no leakage current and the output voltage VOUT changes at t1 from the reference voltage VREF to a voltage representing the capacitance of input capacitor CIN depending on the ratio between input capacitor CIN and reference capacitor CREF and at time t2 back to VREF.

FIG. 4c shows the output voltage VOUT when there is a finite parallel parasitic resistance RPAR. As the leakage current through the resistor charges the reference capacitor CREF, the output voltage shows a slope with a voltage difference dV between time t1 and time t2, not allowing an exact determination of the capacitance of the input capacitor CIN. This slope is detected by a control loop and corrected for by the steered current sink IDAC. FIG. 4d shows the constant compensation current flowing during the time interval between t1 and t2, at the time t1 the switch DAC is switched on and the compensation current starts to flow. The compensation current needed is calculated by the voltage difference VDD-VREF divided by the parallel resistance RPAR.

$$IDAC=(VDD-VREF)/RPAR$$

wherein VDD is the input voltage from the supply voltage source,
VREF is the reference voltage and
RPAR is the resistance of the parallel parasitic resistor.

This correction allows for an output voltage as shown in FIG. 4e. The output voltage VOUT is constant over the time interval t1 to t2, the slope is corrected. But as already mentioned the operational amplifier OP is not infinite fast so that there are glitches at the inverting input of the operational amplifier as shown in FIG. 4f: the voltage first follows at t1 the change from reference voltage VREF to supply voltage VDD and is then regulated by the operational amplifier OP because of its feedback configuration to reference voltage VREF which is applied to the non-inverting input of operational amplifier OP. The speed with which the voltage at the inverting input of operational amplifier OP settles back to the reference voltage VREF depends on the bandwidth of the amplifier. FIG. 5 shows one of the glitches of FIG. 4*f* in a dashed line with a settling period of dt. The continuous line indicates the input voltage with its change from reference voltage VREF to supply voltage VDD.

The triangular waveform of the glitches during the settling period is determined by the slewing current of the operational amplifier OP (typically the tail current of the differential input pair of a typical CMOS operational transconductance amplifier) and the capacitors CREF and COUT. As the current of the steered current source IDAC has been set to compensate for a constant current calculated by dividing the voltage difference between the supply voltage VDD and the reference voltage VREF by the parallel parasitic resistor RPAR, the additional slewing current IOTA is not compensated by steered current source IDAC and leads to an error in the actual output voltage VOUT as indicated in FIG. 4*g*, in which the dashed line indicates the actual output voltage measured and in which the continuous line shows the ideal output voltage which represents the capacitance of the to be measured input capacitor CIN. With a resistance of the parallel resistor RPAR of about 10 kΩ the error current due to the glitches leads to an error in the determination of the capacitance of up to 20 percent.

In the described embodiment the operational amplifier used is a transconductance amplifier because of its slewing behaviour. To compensate at time t1 the voltage difference between the non-inverting input of the operational amplifier which is at the reference voltage VREF and the inverting input which is at the supply voltage VDD, there will be the tail current IOTA which will charge the input capacitor CIN with a constant rate as expressed in the following formula:

$$\text{VDD}-\text{VREF}=\text{IOTA}/\text{CIN}*dt \quad (1)$$

wherein VDD is the input voltage from the supply voltage source, VREF is the reference voltage,
CIN is the capacitance of the input capacitor
IOTA is the tail current supplied from the output of the operational amplifier, i.e. the slewing current.

When the steered current sink is switched on at t1, a current IDAC will flow during the settling time partially through the parallel resistor RPAR and partially through the reference capacitor CREF. Due to the triangular settling shape of the voltage at the inverting input of the operational amplifier which is a result of the slewing behaviour of the operational transconductance amplifier, the error current IERROR is integrated across the reference capacitor CREF and can be averaged to IDAC/2 due to the triangular shape of the IDAC waveform.

This leads to the following two formulas:
1. Charging time=settling time of input capacitor CIN $$dt=\text{CIN}*(\text{VDD}-\text{VREF})/\text{IOTA} \quad (2)$$

which is equivalent to formula (1) and
2. Error current through the reference capacitor CREF:

$$\text{IERROR}=\text{IDAC}/2 \quad (3)$$

The error voltage across the reference capacitor CREF can then be expressed as:

$$\text{VOUTERROR}=\text{IERROR}/\text{CREF}*dt \quad (4)$$

Combining the three equations results in:

$$\text{VOUTERROR}=-\tfrac{1}{2}*\text{CIN}/\text{CREF}*(\text{VDD}-\text{VREF})*\text{IDAC}/\text{IOTA} \quad (5)$$

The resulting error voltage across reference capacitor CREF has a negative value.

In the inventive circuit this error correction is effectuated digitally. As shown in FIG. 1, the analog output voltage VOUT of operational amplifier OP is converted by an analog-to-digital converter ADC to a digital output voltage DOUT. As already explained, the output voltage VOUT of operational amplifier OP represents the coefficient CIN/CREF. Therefore, the digital voltage output DOUT gives the coefficient CIN/CREF in a digital form.

The voltage difference VDD−VREF is the full-scale input range of the analog-to-digital converter and is therefore also available in digital form from the analog-to-digital converter.

The steered current sink is a digitally-controlled current sink so that the current IDAC is a digital control value. As for the tail current IOTA of the operational transconductance amplifier, this is a fixed value which can be expressed as a digital value. Thus, the current ratio IDAC/IOTA in formula (5) is also given in digital form.

The digital error DERROR, which corresponds to the above-mentioned analog error voltage VOUTERROR is given by $$\text{DERROR}=-\text{IDAC}/(2*\text{IOTA})*\text{DOUT}$$

wherein DOUT is the digital output of the analog digital converter and is given by $$\text{DOUT}=(\text{VDD}-\text{VREF})*(\text{CIN}/\text{CREF}).$$

The digital adder DADD shown in FIG. 1 adds the negative digital error DERROR to the digital output voltage DOUT, leading to a corrected digital output voltage DOUT_CORR $$\text{DOUT\_CORR}=\text{DOUT}+\text{DERRROR}.$$

Digitally correcting the error due to the slewing behaviour of the operational amplifier leads to an error as low as 1% for a parasitic resistance of 10 kΩ without the need of a very fast operational amplifier. As there is no need for a high bandwidth, stability is less critical.

Although the present invention has been described with reference to a specific embodiment, it is not limited to this embodiment and no doubt alternatives will occur to the skilled person that lie within the scope of the invention as claimed.

The invention claimed is:

1. A switched capacitor measurement circuit for measuring the capacitance of an input capacitor (CIN) with a parallel parasitic resistor (RPAR), comprising:
    a switching arrangement (S1, S2 . . . S5), a reference capacitor (CREF);
    a steered current sink (IDAC) and an operational amplifier (OP) with an output;
    a non-inverting input connected to a reference voltage source (VREF) and an inverting input connected to a first terminal of the input capacitor (CIN), said switching arrangement selectively connecting:
    in a reset mode, a second terminal of said input capacitor (CIN) with the reference voltage source (VREF), the inverting input of the operational amplifier (OP) with the output of the operational amplifier, and the reference capacitor (CREF) between the reference voltage source (VREF) and the inverting input of the operational amplifier (OP);
    in a gain mode, the second terminal of said input capacitor (CIN) with a supply voltage (VDD), the reference capacitor (CREF) between the inverting input and the output of the operational amplifier (OP), and the steered current sink (IDAC) with an interconnection node between the input capacitor (CIN) and the reference capacitor (CREF);

wherein the current sink (IDAC) is steered by a control loop to compensate for a charge current due to the parasitic resistor (RPAR).

2. The switched capacitor measurement circuit of claim 1 further comprising a digital adder (DADD) and an analog-to-digital converter (ADC) with an analog input connected to the output of the operational amplifier (OP) and a digital output (DOUT) connected to a first input of the digital adder (DADD), a second input of the digital adder receiving a negative digital error signal (DERROR) and the output of the digital adder (DADD) providing a digital capacitance measurement signal (DOUT-CORR) corrected for an error current which is integrated across the reference capacitor (CREF) in the gain mode due to the slewing of the operational amplifier (OP).

3. The switched capacitor measurement circuit according to claim 2, wherein the current sink (IDAC) is steered by a control loop to compensate for a current of (VDD−VREF)/RPAR, wherein VDD is the input voltage from the supply voltage source,
VREF is the reference voltage and
RPAR is the resistance of the parasitic resistor.

4. The switched capacitor measurement circuit according to claim 3, wherein the digital error signal (DERROR) is determined by the formula:

DERROR =−IDAC/(2*IOTA)*DOUT wherein
DERROR is the digital error signal,
IDAC is the current that flows to the current sink in gain mode,
IOTA is the slewing current supplied from the output of the operational amplifier,
DOUT is the digitalized output voltage of the operational amplifier.

5. The switched capacitor measurement circuit according to claim 4, wherein the operational amplifier (OP) is a transconductance amplifier.

6. The switched capacitor measurement circuit according to claim 3, wherein the operational amplifier (OP) is a transconductance amplifier.

7. The switched capacitor measurement circuit according to claim 2, wherein the digital error signal (DERROR) is determined by the formula:

DERROR=−IDAC/(2*IOTA)*DOUT wherein
DERROR is the digital error signal,
IDAC is the current that flows to the current sink in gain mode,
IOTA is the slewing current supplied from the output of the operational amplifier,
DOUT is the digitalized output voltage of the operational amplifier.

8. The switched capacitor measurement circuit according to claim 7, wherein the operational amplifier (OP) is a transconductance amplifier.

9. The switched capacitor measurement circuit according to claim 2, wherein the digital error signal (DERROR) is determined by the formula:

DERROR =−IDAC/(2*IOTA)*DOUT wherein
DERROR is the digital error signal,
IDAC is the current that flows to the current sink in gain mode,
IOTA is the slewing current supplied from the output of the operational amplifier,
DOUT is the digitalized output voltage of the operational amplifier.

10. The switched capacitor measurement circuit according to claim 2, wherein the operational amplifier (OP) is a transconductance amplifier.

11. The switched capacitor measurement circuit according to claim 1, wherein the current sink (IDAC) is steered by a control loop to compensate for a current of (VDD−VREF)/RPAR, wherein VDD is the input voltage from the supply voltage source,
VREF is the reference voltage and
RPAR is the resistance of the parasitic resistor.

12. The switched capacitor measurement circuit according to claim 11, wherein the digital error signal (DERROR) is determined by the formula:

DERROR=−IDAC/(2*IOTA)*DOUT wherein
DERROR is the digital error signal,
IDAC is the current that flows to the current sink in gain mode,
IOTA is the slewing current supplied from the output of the operational amplifier,
DOUT is the digitalized output voltage of the operational amplifier.

13. The switched capacitor measurement circuit according to claim 12, wherein the operational amplifier (OP) is a transconductance amplifier.

14. The switched capacitor measurement circuit according to claim 11, wherein the operational amplifier (OP) is a transconductance amplifier.

15. The switched capacitor measurement circuit according to claim 1, wherein the operational amplifier (OP) is a transconductance amplifier.

16. A method of switched capacitor measurement circuit for measuring the capacitance of an input capacitor (CIN) with a parallel parasitic resistor (RPAR), comprising:

in a first mode, coupling a second terminal of said input capacitor (CIN) with a reference voltage source (VREF);
coupling the inverting input of an operational amplifier (OP) with an output of the operational amplifier; and
coupling a reference capacitor (CREF) between a reference voltage source (VREF) and an inverting input of the operational amplifier (OP); and
in a second mode, coupling a second terminal of said input capacitor (CIN) with a supply voltage (VDD);
coupling the reference capacitor (CREF) between the inverting input and the output of the operational amplifier (OP); and
coupling a steered current sink (IDAC) with an interconnection node between the input capacitor (CIN) and the reference capacitor (CREF);
wherein the current sink (IDAC) is steered to compensate for a charge current due to the parasitic resistor (RPAR).

17. The method of switched capacitor measurement of claim 16, further comprising:
- coupling a digital adder (DADD) and an analog-to-digital converter (ADC) with an analog input connected to the output of the operational amplifier (OP) and a digital output (DOUT) connected to a first input of the digital adder (DADD),
- coupling a second input of the digital adder for receiving a negative digital error signal (DERROR) and
- wherein the output of the digital adder (DADD) providing a digital capacitance measurement signal (DOUT-CORR) corrected for an error current which is integrated across the reference capacitor (CREF) in the second mode due to the slewing of the operational amplifier (OP).

18. The method of switched capacitor measurement according to claim 17, wherein the first mode is a reset mode and the second mode is a gain mode.

19. The method of switched capacitor measurement according to claim 16, wherein the first mode is a reset mode and the second mode is a gain mode.

* * * * *